United States Patent
Staszewski et al.

(10) Patent No.: US 6,429,693 B1
(45) Date of Patent: Aug. 6, 2002

(54) DIGITAL FRACTIONAL PHASE DETECTOR

(75) Inventors: Robert B. Staszewski, Garland; Dirk Leipold, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/608,317

(22) Filed: Jun. 30, 2000

(51) Int. Cl.[7] ............... H03D 3/24; H03L 7/06
(52) U.S. Cl. ............... 327/12; 327/3; 327/158; 327/107
(58) Field of Search ................ 327/2, 3, 113, 327/117, 156, 158, 159, 12, 105, 106, 107

(56) References Cited

U.S. PATENT DOCUMENTS 5,568,071 A * 10/1996 Hoshino et al. ............ 327/3
5,796,682 A * 8/1998 Swapp ................ 368/120
6,125,158 A * 9/2000 Carson et al. ............ 327/158

* cited by examiner

Primary Examiner—Dinh T. Le
(74) Attorney, Agent, or Firm—Ronald O. Neerings; Wade James Brady, III; Frederick J. Telecky, Jr.

(57) ABSTRACT

A digital fractional phase detector is provided to realize a frequency synthesizer architecture that naturally combines transmitter modulation capability with a wideband all-digital PLL modulation scheme to maximize a digitally-intensive implementation by operating in a synchronous phase domain. Synchronous logic is provided across a digitally controlled VCO and is synchronous to the VCO output clock by implementing a timing adjustment in association with a reference calculation to allow a frequency control word to contain both channel information and transmit modulation information. The digital fractional phase detector is capable of accommodating a quantization scheme to measure fractional delay differences between the significant edge of the VCO output clock and a reference clock by using a time-to-digital converter to express the time difference as a digital word for use by the frequency synthesizer.

29 Claims, 4 Drawing Sheets

$\varepsilon = \Delta t_r / 2(\Delta t_f - \Delta t_r)$ $\Phi_F = -\Delta t_r / 2(\Delta t_f - \Delta t_r)$ $\varepsilon = \Delta t_r / 2(\Delta t_r - \Delta t_f)$ $\Phi_F = 1 - \Delta t_r / 2(\Delta t_r - \Delta t_f)$

DIGITAL FRACTIONAL PHASE DETECTOR

BACKGROUND OF THE INVENTION

1. Field of the Invention

This invention relates generally to frequency synthesizers, and more particularly to a fractional phase detector that increases the overall resolution of an integer phase-locked loop such that the quantization error of the integer phase-locked loop is corrected.

2. Description of the Prior Art

Frequency synthesizers using analog circuit techniques are well known in the art. Conventional RF frequency synthesizer architectures are analog-intensive and generally require a low loop bandwidth to reduce the familiar and well-known reference or compare frequency spurs. Low loop bandwidths are acceptable for RF-BiCMOS and RF-SiGe processes with weak digital capabilities.

Modern deep sub-micron CMOS processes and their RF-CMOS derivatives, however, are not very compatible with frequency synthesizer designs using analog circuit techniques. The conventional PLL-based frequency synthesizers generally comprise analog-intensive circuitry that does not work very well in a voltage-headroom-constrained aggressive CMOS environment. Such frequency synthesizers do not take advantage of recently developed high density digital gate technology.

Newer frequency synthesizer architectures have used sigma-delta modulated frequency divider techniques to randomize the above discussed frequency spurs by randomizing the spurious content at the cost of increased noise floor. These techniques have not significantly reduced the undesirable analog content. Other frequency synthesizer architectures have used direct digital synthesis (DDS) techniques that do not work at RF frequencies without a frequency conversion mechanism requiring an analog solution. Further, previous all-digital PLL architectures rely on an over-sampling clock. Such architectures cannot be used at RF frequencies.

In view of the foregoing, it is highly desirable to have a technique to implement a digitally-intensive frequency synthesizer architecture that is compatible with modern CMOS technology and that has a phase quantization resolution of better than +/−π to accommodate wireless applications.

SUMMARY OF THE INVENTION

The present invention is directed to a digital fractional phase detector for an all-digital phase domain PLL frequency synthesizer that is compatible with deep sub-micron CMOS processes. The all-digital phase domain PLL frequency synthesizer accommodates direct frequency/phase modulation transmission to remove the requirement for an additional transmitting modulator normally associated with wireless digital transmitters. This is accomplished by operating the PLL entirely in the phase domain with maximum digital processing content such that the loop can be of high-bandwidth of "type 1" without the need for a loop filter. A "type 1" PLL loop, as used herein, means a loop having only one integrating pole in the feedback loop. Only one integrating pole exists due to the VCO frequency-to-phase conversion. It is possible therefore, to eliminate a low-pass filter between the phase detector and the oscillator tuning input, resulting in a high bandwidth and fast response of the PLL loop.

According to one embodiment, the all-digital phase domain PLL frequency synthesizer contains only one major analog component, a digitally-controlled 2.4 GHz voltage controlled oscillator (VCO or dVCO). The PLL loop is an all-digital phase domain architecture whose purpose is to generate the 2.4 GHz high frequency $f_{osc}$ for the "BLUETOOTH" standard. The underlying frequency stability of the system is derived from a reference crystal oscillator, such as a 13 MHz TCXO for the global system for mobile communications (GSM) system. The phase of the VCO output is obtained by accumulating the number of significant (rising or falling) edge clock transitions. The phase of the reference oscillator is obtained by accumulating a frequency control word on every significant (rising or falling) edge of the reference oscillator output that is re-clocked via the VCO output. As used herein, "significant edge" means either a "rising" or a "falling" edge. A ceiling element continuously adjusts a reference phase value associated with the accumulated frequency control word by rounding off to the next integer (alternatively, truncating fractional bits necessary) to compensate for fractional-period delays caused by re-clocking of the reference oscillator by the VCO output. The phase error signal is then easily obtained by using a simple arithmetic subtraction of the VCO phase from the adjusted reference phase on every significant edge of the re-clocked reference oscillator output. The phase error signal can then be used as the tuning input to the digitally-controlled VCO directly via a gain element associated with the PLL loop operation.

Due to the VCO edge counting nature of the PLL (all-digital phase domain architecture), the phase quantization resolution cannot be better than +/−π radians of the frequency synthesizer VCO clock. The present digital fractional phase detector is capable of accommodating a quantization scheme to measure fractional delay differences between the significant edge of the frequency synthesizer VCO clock and an external reference oscillator clock. According to one embodiment, the digital fractional phase detector has a time-to-digital converter having a resolution determined by an inverter delay associated with a given CMOS process. The digital fractional phase is determined by passing the frequency synthesizer VCO clock through a chain of inverters such that each inverter output will produce a clock pulse slightly delayed from that of the immediately previous inverter. The resultant staggered clock phases would then be sampled by the same reference clock.

In one aspect of the invention, a digital fractional phase detector system is provided that allows fast design turn-around using automated CAD tools.

In still another aspect of the invention, a digital fractional phase detector system is provided to implement an all-digital phase domain PLL frequency synthesizer having much less undesirable parameter variability than normally associated with analog circuits.

In yet another aspect of the invention, a digital fractional phase detector system is provided to implement an all-digital phase domain PLL frequency synthesizer having enhanced testability features.

In yet another aspect of the invention, a digital fractional phase detector system is provided to implement an all-digital phase domain PLL frequency synthesizer that requires desirably low silicon area to physically implement.

In yet another aspect of the invention, a digital fractional phase detector system is provided to implement an all-digital phase domain PLL frequency synthesizer that requires lower power than conventional frequency synthesizers.

In still another aspect of the invention, a digital fractional phase detection system is provided to implement an all-digital phase domain PLL frequency synthesizer having direct frequency/phase modulation transmission capability to minimize system transmitter requirements.

In still another aspect of the invention, a digital fractional phase detection system is provided to implement an all-digital phase domain PLL frequency synthesizer that accommodates the "BLUETOOTH" communication protocol.

In yet another aspect of the invention, a digital fractional phase detection system is provided to increase the overall resolution of an integer phase-locked loop such that the quantization error of the integer phase-locked loop is corrected.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENT

Figure 1:
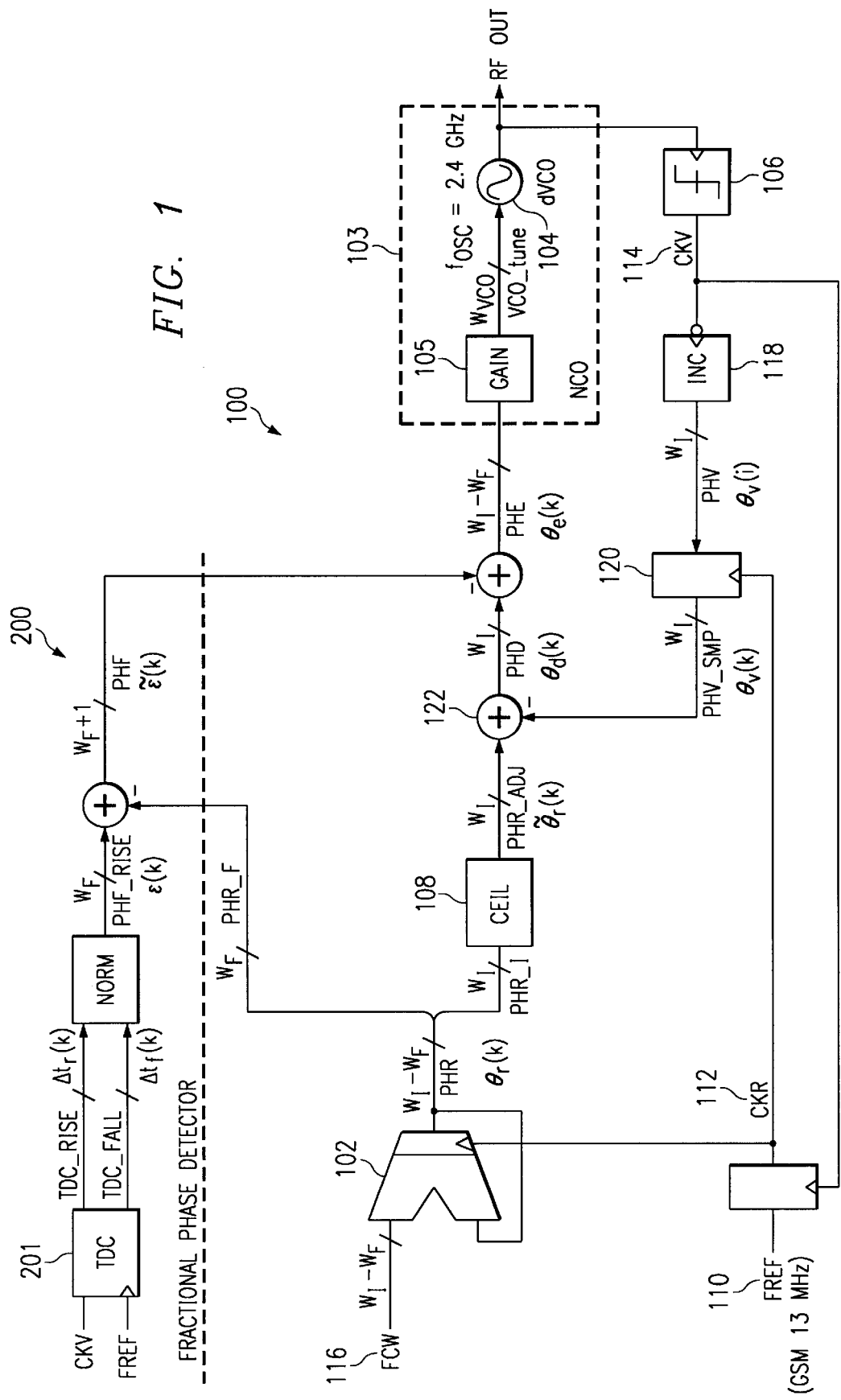
FIG. 1 illustrates an all-digital PLL synthesizer.

FIG. 1 illustrates an all-digital PLL synthesizer 100. The synthesizer 100 naturally combines transmitter frequency modulation capability with a wideband, all-digital PLL modulation technique to maximize digitally-intensive implementation by operating in a synchronous phase domain. The PLL loop utilizes an all-digital phase domain architecture capable of generating the 2.4 GHz high frequency $f_{osc}$ for the "BLUETOOTH" standard band. Accordingly, the all-digital phase domain PLL frequency synthesizer 100 depicted in FIG. 1 contains only one major analog/RF component, a digitally-controlled 2.4 GHz voltage controlled oscillator (dVCO) 104, being a portion of a numerically-controlled oscillator (NCO) 103, that also comprises a gain element 105. The underlying frequency stability of the synthesizer 100 is derived from a frequency reference crystal oscillator 110, such as a 13 MHz TCXO for the GSM system.

The phase $\theta_v(iT_v)$ of the dVCO 104 clock signal, CKV 114, with period $T_v$, at time instances $iT_v$, where i is an integer, is obtained by accumulating the number of rising- or falling-edge clock transitions generated via a sinusoidal-to-digital converter 106.

$$\theta_v(iT_v) = \sum_{t=0}^{i\cdot T_v} f_v(t) \ (x2\pi \cdot \text{rad}) \qquad (1)$$

Without use of frequency reference retiming (described herein below), the phase $\theta_r(kT_r)$ of a frequency reference clock, FREF, provided by the reference crystal oscillator (FREF) 110, with period $T_r$, at time instances $kT_r$ where k is another integer, is obtained by accumulating 102 the frequency control word (FCW 116) on every rising (or falling) edge of the frequency reference clock FREF.

$$\theta_r(kT_r) = FCW \cdot k \cdot T_r (x2\pi \cdot rad) \qquad (2)$$

The PLL operation achieves, in a steady-state condition, a zero averaged phase difference between the dVCO 104 $\theta_v(iT_v)$ and the reference crystal oscillator 110 $\theta_r(kT_r)$ phases. Equation (3) below shows the clock period relationship in the mean sense.

$$FCW = N_i + N_f = T_r/T_v \qquad (3)$$

The present invention is not so limited however, and it shall be readily understood that FCW 116 can be comprised of only an integer or an integer ($N_i$) and fractional ($N_f$) parts.

As stated herein before, there is no need for a frequency detection function within the phase detector when operating the PLL loop in the phase domain. This feature importantly allows "type 1" operation of the PLL, where it is possible to eliminate a low-pass filter between the phase detector and the oscillator (dVCO 104), resulting in a high-bandwidth and fast response of the PLL loop.

The dVCO 104 and the reference crystal oscillator 110 clock domains are entirely asynchronous, making it difficult to physically compare the two digital phase values $\theta_v(iT_v)$ and $\theta_r(kT_r)$ at different time instances $iT_v$ and $kT_r$. Mathematically, $\theta_v(iT_v)$ and $\theta_r(kT_r)$ are discrete-time signals with incompatible sampling times and cannot be directly compared withoutsome sort of interpolation. The present inventors recognized therefore, it is imperative that any digital-word comparison be performed in the same clock domain. This function is achieved by over-sampling the FREF reference oscillator 110 by the high-rate dVCO 104 output CKV 114, and using the resulting frequency reference clock CKR 112 to accumulate via accumulator 102 the reference phase $\theta_r(kT_r)$ as well as to synchronously sample, via latch/register 120, the high-rate dVCO 104 phase $\theta_v(iT_v)$. Since the foregoing phase comparison is performed synchronously at the rising edge of CKR 112, equations (1) and (2) can now be rewritten as follows:

$$\theta_v(k) = \sum_{t=0}^{k \cdot T_r} f_v(t) \quad (x2\pi \cdot \text{rad}) \tag{4}$$

$$\theta_r(k) = FCW \cdot k \cdot T_r + \epsilon(k) \quad (x2\pi \cdot rad) \tag{5}$$

where the index k is the kth transition of the re-timed reference clock CKR 112 and contains an integer number of CKV 114 clock transitions; and $\epsilon(k)$ is the integer-loop quantization error, in the range of $\epsilon \in (0,1)$, that could be further corrected by other means, such as a fractional phase detector 200 discussed in more detail herein below with reference to FIGS. 2–6.

In view of the above, the integer phase detector in the synchronous digital phase environment can now be realized as a simple arithmetic subtraction via combinatorial element 122 of the dVCO 104 phase from the reference phase performed every rising edge of the CKR clock 112.

$$\theta_d(k) = \theta_r(k) - \theta_v(k) \tag{6}$$

The reference re-timing operation can be recognized as a quantization in the dVCO 104 CKV 114 clock transitions integer domain, where each CKV 114 clock transition rising edge is the next integer. Since the synthesizer 100 must be time-causal, quantization to the next CKV 114 clock transition rising edge (next integer), rather than the closest transition (rounding-off to the closest integer), can only be realistically performed. This limitation is then compensated for in the phase domain by the ceiling element 108 associated with the reference phase since the reference phase $\theta_r(k)$ is generally a fixed-point arithmetic signal having a sufficiently large fractional part to achieve the required frequency resolution as set forth in Equation 3 above. As stated herein before, a ceiling element 108 continuously adjusts a reference phase value associated with the accumulated frequency control word by rounding to the next integer (alternatively, truncating the fractional bits), thereby compensating for delays caused by re-clocking of the reference oscillator 110 by the VCO output CKV 114. The ceiling operation (demonstrated via Equation 7) could be easily implemented by discarding the fractional bits and incrementing the integer bits. This technique, however, improperly handles the case when the fractional part is zero, but has no practical consequences. Those skilled in the art will appreciate that this truncation process achieves a timing correction since phase is a characteristic that can be used to describe a time progression. The phase resolution, however, cannot be better than $+/-\pi$ radians of the dVCO 104 clock, even though the foregoing integer-loop quantization error $\epsilon$ due to reference phase retiming illustrated by Equation 5 is compensated by next-integer rounding operation (ceiling) of the reference phase.

$$\theta_r(k) = \lceil \theta_r(k) \rceil \tag{7}$$

Figure 7:
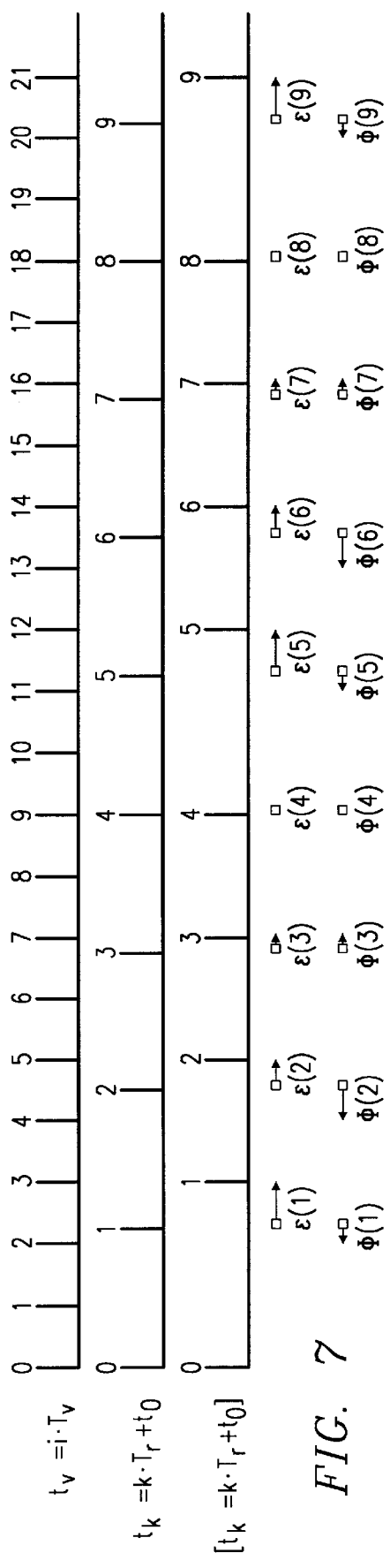
FIG. 7 illustrates an example of integer-loop quantization error for a simplified case of the fractional-N frequency division ratio of N=2¼.

Jumping now to FIG. 7, an example of integer-loop quantization error $\epsilon$ is illustrated for a simplified case of the frequency division ratio of N=2¼. Unlike $\epsilon(k)$, which represent rounding to the "next" VCO edge, $\phi(k)$ is the fractional phase error; and it represents rounding to the "closest" VCO edge.

Figure 2:
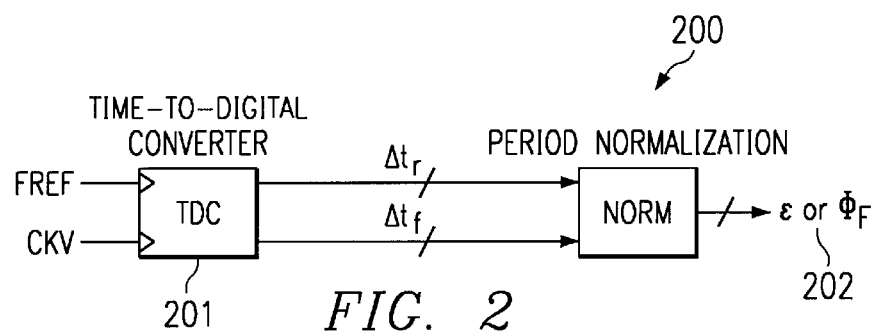
FIG. 2 is a simple block diagram illustrating a quantization scheme for fractional-phase detection associated with the synthesizer depicted in FIG. 1.

Moving now to FIG. 2, a simple block diagram illustrates a digital fractional phase detector system 200 according to one embodiment of the present invention. The system 200 is capable of accommodating a quantization scheme to measure fractional (sub-Tv) delay differences between the significant edge of the dVCO 104 clock CKV 114 and the FREF oscillator 110 reference clock 112. The system 200 uses a time-to-digital converter (TDC) 201 with a resolution of $\Delta t_{ref}$ and expresses the time difference as a digital word. Due to the dVCO 104 edge counting nature of the PLL, it can be appreciated that the phase quantization resolution cannot be better than $+/-\pi$ radians as stated above. A much finer phase resolution however, is required for wireless applications such as "BLUETOOTH." Such finer resolution must be achieved without forsaking the requisite digital signal processing capabilities.

Figure 8:
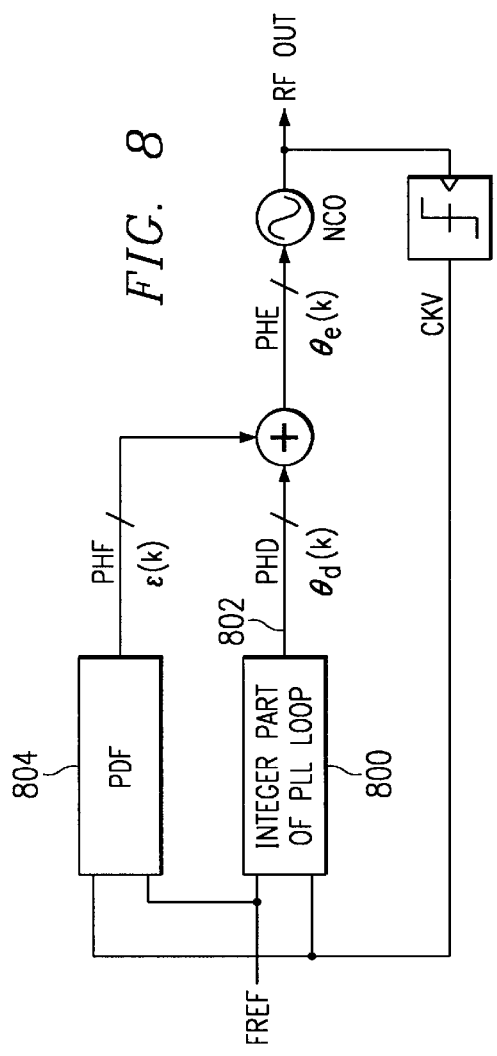
FIG. 8 is a simplified schematic diagram illustrating a scheme for correcting the integer-loop quantization error $\epsilon(k)$ by means of a fractional phase detector (PDF) for the all-digital PLL synthesizer shown in FIG. 1.

FIG. 8 is a simplified schematic diagram illustrating a scheme for correcting the integer-loop quantization error $\epsilon(k)$ by means of a fractional phase detector (PDF) 804 for the all-digital PLL synthesizer 100 shown in FIG. 1. The phase output, PHD 802, of the integer part of the PLL-loop 800, contains the fractional part of the accumulated FCW word 116, $\text{frac}(\theta_r)$, if the desired fractional division ratio FCW 116 is generally fractional-N. A preferred alternative method by which $\text{frac}(\theta_r)$ is subtracted from both the integer reference phase $\theta_r$ and the fractional correction $\epsilon(k)$ is discussed herein below with reference to FIGS. 2–6, and is captured schematically on FIG. 1. The solution illustrated in FIG. 2 measures the one-sided fractional (sub-$T_v$) delay difference between the dVCO 104 clock CKV 114 and the FREF oscillator 110 clock 112 to express the time difference as a digital word $\epsilon$ 202. According to one embodiment, the maximum readily achievable timing resolution of the digital fractional phase detector 200 is determined by an inverter delay associated with a given CMOS process, and is about 40 psec for the C035.1 CMOS process developed by Texas Instruments Incorporated of Dallas, Tex. The digital fractional phase is determined by passing the dVCO 104 clock CKV 114 through a chain of inverters (such as shown in FIG. 5), such that each inverter output would produce a clock pulse slightly delayed from that of the immediately previous inverter. The resultant staggered clock phases would then be sampled by the same reference clock.

Figure 3:
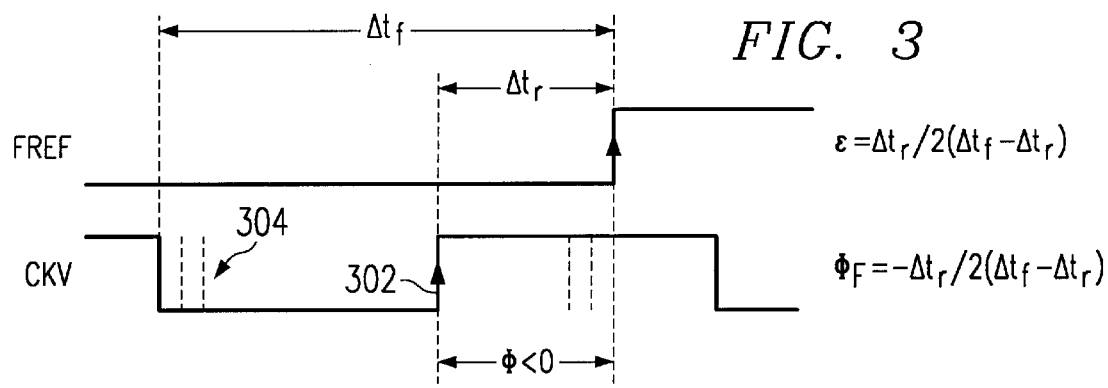
FIG. 3 is a timing diagram illustrating a frequency reference clock signal and a VCO clock signal for a negative fractional-phase.
Figure 4:
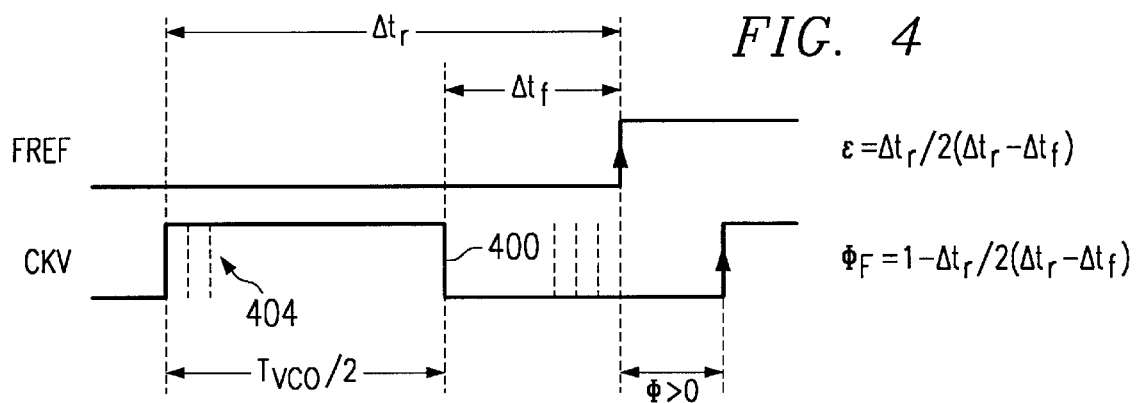
FIG. 4 is a timing diagram illustrating a frequency reference clock signal and a VCO clock signal for a positive fractional-phase.
Figure 5:
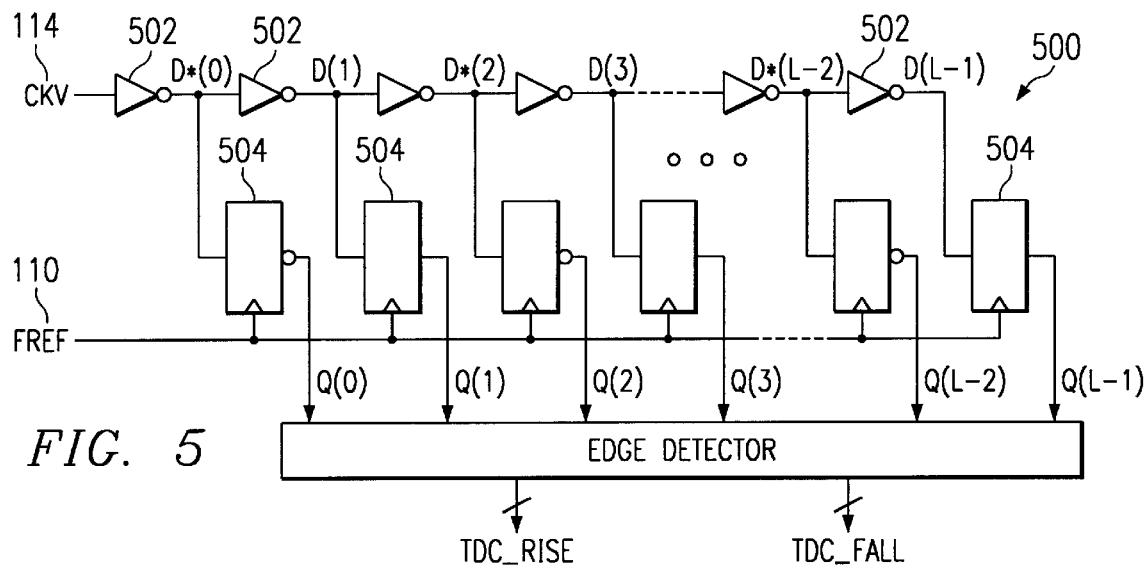
FIG. 5 is a schematic diagram illustrating a time-to-digital converter according to one embodiment of the present invention and that is suitable to implement the quantization scheme depicted in FIG. 2.

As seen in FIGS. 3 and 4, position of the detected transition from 1 to 0 would indicate a quantized time delay $\Delta T_r$ between the FREF 110 sampling edge and the rising edge 302 of the dVCO clock, CKV 114 in $\Delta$tres multiples; and position of the detected transition from 0 to 1 would indicate a quantized time delay $\Delta T_f$ between the FREF 110 sampling edge and the falling edge 400 of the dVCO clock, CKV 114. Because of the time-causal nature of the foregoing digital fractional phase detection process, both time delay values $\Delta T_r$ and $\Delta T_f$ must be interpreted as non-negative. This is fine if $\Delta T_r$ is smaller than $\Delta T_f$ since this situation corresponds to the negative phase error of the classical PLL loop in which the VCO edge is ahead of the reference edge and, therefore, the phase sign has to be negated. If $\Delta T_r$ is greater than $\Delta T_f$ however, the situation becomes problematic since the situation now corresponds to the positive phase error of the classical PLL loop. The time lag between the reference edge FREF 110 and the following rising edge of CKV 114 must be based on the available information regarding the delay between the preceding rising edge of CKV 114 and the reference edge FREF 110 as well as the clock half-period which can be expressed as a difference as shown by Equation 8 below.

$$T\sqrt{2} = \begin{cases} \{\Delta t_r - \Delta t_f & \Delta t_r \geq \Delta t_f \\ \{\Delta t_f - \Delta t_r & \text{otherwise} \end{cases} \quad (8)$$

The foregoing analysis is summarized in Equation 9 below, where $\Delta t_{frac}$ is the digital fractional phase detector error.

$$\Delta t_{frac} = \begin{cases} -\Delta t_r & \Delta t \leq \Delta t_f \\ \Delta t_r - 2 \cdot \Delta t_f & \text{otherwise} \end{cases} \quad (9)$$

The period-normalized fractional phase is then described by Equation 10 as:

$$\phi_F = \Delta t_{frac}/T_v \quad (10)$$

In the instant embodiment, where the integer phase detector output, $\theta_d$, is used, the fractional phase $\phi_F$ is not needed. Instead, $\Delta t_r$ is used to calculate the $\epsilon(k)$ correction of Equation 5 that is positive and $\epsilon \in (0,1)$. $\epsilon t_r$ has to be normalized by dividing it by the clock period, in. order to properly combine it with the integer phase detector output, θd.

$$\varepsilon(k) = \Delta t_r(k)/T_v(k) = \begin{cases} \Delta t_r/2(\Delta t_f - \Delta t_r) & \Delta t_r < \Delta t_f \\ \Delta t_r/2(\Delta t_r - \Delta t_f) & \text{otherwise} \end{cases} \quad (11)$$

When the dVCO 104 clock period $T_v$ is an integer division of the frequency reference clock period $T_r$, the $\epsilon(k)$ samples, are seen to be constant. The $\epsilon(k)$ samples increase linearly within the modulo (0,1) range where this ratio is fractional. In view of the foregoing, a simple pattern can therefore be easily predicted in digital form that closely corresponds mathematically to the well-known analog fractional phase compensation scheme of fractional-N PLL frequency synthesizers. FIG. 7.illustrates an example of. the predicted behavior of $\epsilon(k)$.

$$\epsilon(k) = \epsilon(k) - fract(\theta_r(k)) \quad (12)$$

The composite phase error $\theta_e(k)$ is obtained through correcting the integer-valued $\theta_d(k)$ by fractional-division-ratio-corrected $\epsilon(k)$ as shown in Equation 13.

$$\theta_e(k) = \theta_d(k) - \epsilon(k) \quad (13)$$

The fractional phase detector output $\epsilon(k)$ or $\phi_F(k)$ sequence can be easily compared on a bit-by-bit basis; and since the expected output pattern is known in advance and is now in the digital format, a better alternative of a Viterbi sequence detection or a matched filter could be used. In such a scenario, the space difference between the observed and expected patterns could be output as the fractional phase error. This solution provides a system with less reference feedthrough and lower overall error.

The present PLL loop operation can be further enhanced by taking advantage of the predictive capabilities of the all-digital PLL loop. The dVCO 104, for example, does not necessarily have to follow the modulation FCW 116 command with the normal PLL loop response. In one embodiment, where the dVCO 104 control and the resulting phase error measurement are in numerical format, it is easy to predict the current $K_{VCO}$ gain of the dVCO 104 by simply observing the past phase error responses to the NCO cor- rections. With a good estimate of the $K_{VCO}$ gain, the normal NCO control could be augmented with the "open loop" instantaneous frequency jump estimate of the new FCW 116 command. It can be appreciated that the resulting phase error should be very small and subject to the normal closed PLL loop correction transients.

Since the time response of this "type 1" PLL is very fast (less than 1 μsec), the prediction feature is less important for channel hopping, where the allowed time is much greater. The foregoing prediction feature is, however, essential to realize the direct frequency synthesizer modulation in the Gaussian frequency shift keying GFSK modulation scheme of "BLUETOOTH" or GSM.

FIG. 5 is a schematic diagram illustrating a time-to-digital converter 500 according to one embodiment of the present invention and that is suitable to implement the time delay quantization scheme depicted in FIG. 2. The time-to-digital converter 500 includes a plurality of inverter delay elements 502 and latch/registers 504. As the dVCO clock CKV 114 continues to run, the CKV 114 delayed vector is latched into the storage elements (latch/registers 504). It is readily apparent that the converter can be formulated from any desired number of inverter delay elements 502 and latch/registers 504, within certain physical limitations, so long as the total delay of the inverter array sufficiently covers the CKV 114 clock period. The delayed vector characteristics are therefore dependent upon the total number of inverter delay elements 502, delay values of individual inverter delay elements 502, and associated latch/registers 504 used to formulate the time-to-digital converter 500. During a positive transition (enumerated 602 in FIG. 6) of the reference clock FREF 110, each of the latch/registers 504 will be queried in order to obtain a snapshot of the quantized fractional phase difference between the dVCO 104 clock signal CKV 114 phase and the reference clock FREF 110 signal phase. The accuracy of the snapshot or indication of the fractional phase difference can be seen to depend upon the single inverter delay elements.

Figure 6:
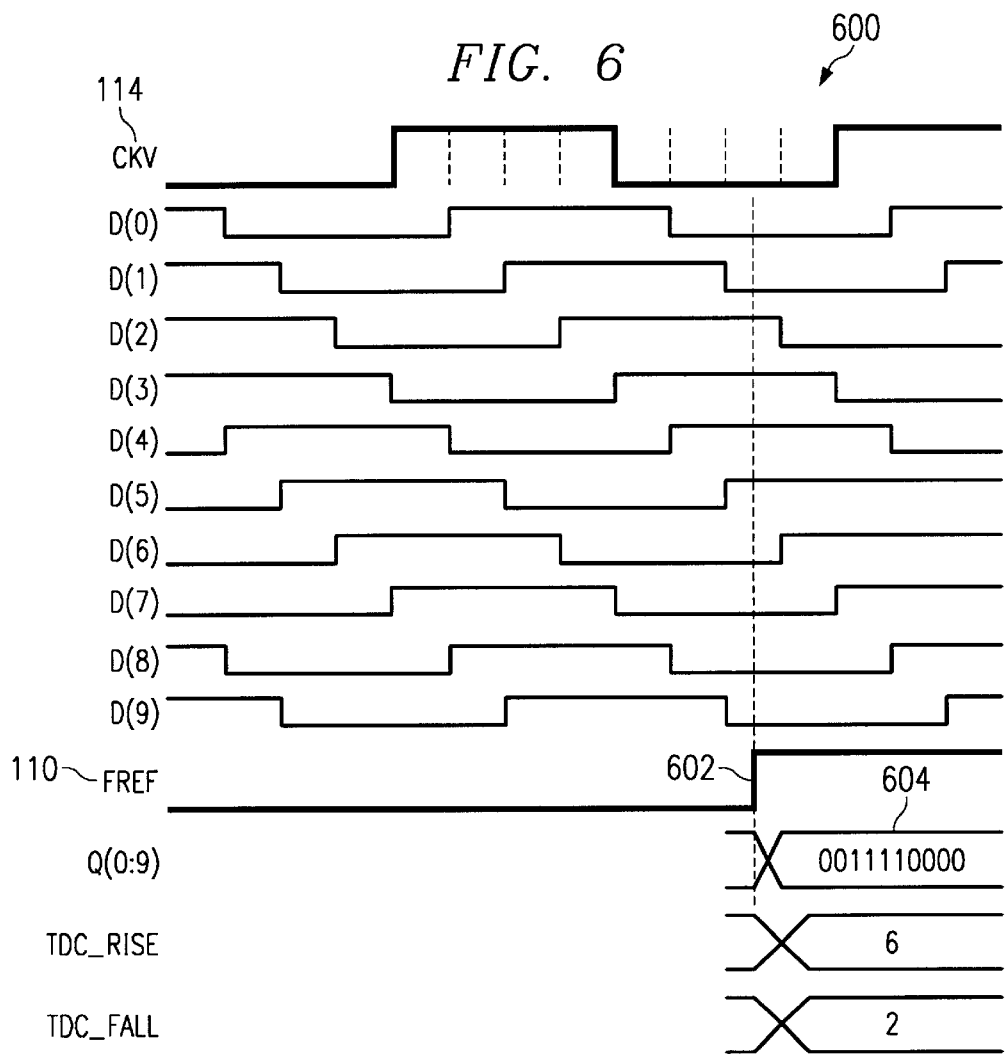
FIG. 6 is a timing diagram associated with the time-to-digital converter shown in FIG. 5.

FIG. 6 is a timing diagram 600 associated with the time-to-digital converter 500 shown in FIG. 5. During a positive transition 602 of the reference oscillator FREF 110, the plurality of latch/registers 504 are accessed to obtain a snapshot 604 of the delayed replicas of the dVCO clock CKV 114 relative to the rising edge of the reference oscillator FREF 110. The snapshot 604 can be seen to express the time difference as a digital word. With continued reference to FIGS. 3 and 4, the timing pulses 304, 404 represent dVCO output clock CKV 114 cycles that are captured in the latch/registers 504 during each significant transition of the FREF clock 110. The foregoing digital word is then used by the frequency synthesizer 100 to compensate for phase differences between the significant edge of the dVCO clock CKV 114 and the reference oscillator FREF 110 as discussed herein above with reference to both FIGS. 2–4 and equations 8–13.

In view of the above, it can be seen the present invention presents a significant advancement in the art of RF synthesizer circuits and associated methods. This invention has been described in considerable detail in order to provide those skilled in the RF synthesizer art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A digital fractional phase detector comprising:
   a time-to-digital converter (TDC) having a plurality of delay elements associated with a first input and a plurality of latch/register elements associated wit both a second input and a plurality of outputs, wherein the fist input is configured to receive a first clock signal, and further wherein the second input is configured to receive a reference clock signal such that the plurality of latch/register elements store a snapshot of a delayed replica vector of first clock signal data in response to significant edge transitions associated with the reference clock signal; and
   a digital edge detector having a plurality of inputs in communication with the plurality of outputs, and fixer having first and second outputs, wherein the edge detector is responsive to the delayed replica vector of first clock data such that the fist output generates a TDC rse-time signal associated with timing of a positive transition of the first clock signal and further wherein the edge detector is responsive to the stream of first clock state data such that the second output generates a TDC fall-dine signal associated with timing of a negative transition of the fist clock signal.

2. The digital fractional phase detector according to claim 1 further comprising a normalizer element having a first input configured to receive the TDC rise-time signal and further having a second input configured to receive the TDC fall-time signal, wherein the normalizer element is responsive to the TDC rise-time signal and the TDC fall-time signal to generate a period-normalized fractional phase signal that is normalized by a clock period associated with the first clock signal.

3. The digital fractional phase detector according to claim 2 further comprising a combinatorial element configured to combine the period-normalized fractional phase signal with an accumulated frequency control word fractional phase signal and generate a fractional phase compensated signal therefrom.

4. The digital fractional phase detector according to claim 1 wherein the plurality of delay elements comprise inverters.

5. The digital fractional phase detector according to claim 4 wherein the first clock signal is associated with a numerically-controlled voltage controlled oscillator.

6. The digital fractional phase detector according to claim 1 wherein the plurality of delay elements are selected from the group consisting of buffers, a tapped delay line, and inverters.

7. The digital fractional phase detector according to claim 1 wherein the digital fractional phase detector is configured to increase overall resolution of an integer phase-locked loop (PLL) such that a quantization error e of the integer PLL will be corrected.

8. The digital fractional phase detector according to claim 1 further comprising a digital edge detector in communication with the plurality of latch/register elements and configured to generate a first time-to-digital signal associated with a timing of a first transition of the first clock and further configured to generate a second time-to-digital signal associated with a timing of a second transition of the first clock.

9. A digital fractional phase detector comprising:
   a first input configured to receive a first clock signal;
   a plurality of delay elements in communication with the first input;
   a second input configured to receive a second clock signal;
   a plural of latch/registers in communication with the plurality of delay elements and the second input such that the plurality of latch/registers store a delayed replica of fist clock signal data in response to significant edge transitions associated with the second clock signal;
   a digital edge detector in communication with the plurality of latch/registers and configured to generate a time-to-digital rise-time signal associated with a timing of a positive transition of the first clock signal and further configured to generate a time-to digital fall-time signal associated with a timing of a negative transition of the first clock;
   a normalizer element responsive to the rise-time signal and the fall-time signal to generate a period-normalized fractional phase signal that is normalized to a clock period associated with the first clock signal; and
   an output, wherein the digital factional phase detector is responsive to the first and second clock signals such that it generates a fractional phase compensated signal therefrom at the output, wherein the fractional phase compensated signal affects a zero averaged phase difference between the first clock signal and the second clock signal.

10. The digital fractional phase detector according to claim 9 wherein the plurality of delay elements comprise inverters.

11. The digital fractional phase detector according to claim 9 wherein the plurality of delay elements are selected from the group consisting of buffers, a tapped delay line, and inverters.

12. The digital fractional phase detector according to claim 9 further comprising a combinatorial element configured to combine the period-normalized fractional phase signal with an accumulated frequency control word fractional phase signal and generate a fractional phase compensated signal therefrom.

13. The digital fractional phase detector according to claim 12 wherein the first clock signal is associated with a numerically-controlled voltage controlled oscillator.

14. The digital fractional phase detector according to claim 13 wherein the second clock signal is associated with a frequency reference oscilator.

15. The digital fractional phase detector according to claim 9 wherein the first clock signal is associated with a numerically-controlled voltage controlled oscillator.

16. The digital fractional phase detector according to claim 15 wherein the second clock signal is associated with a frequency reference oscillator.

17. The digital fractional phase detector according to claim 9 wherein the digital fractional phase detector is configured to increase overall resolution of an integer phase-locked loop (PLL) such that a quantization error $\epsilon$ of the integer PLL will be corrected.

18. A digital factional phase detector comprising:
   means for receiving a digitally-controlled voltage controlled oscillator (dVCO) clock signal;
   means for receiving a frequency reference clock signal and storing a snapshot of a delayed replica of said dVCO clock signal data in response to significant edge transitions associated with the frequency reference clock signal;

means for retrieving the delayed replica of said dVCO clock signal data in response to the frequency reference clock signal and generating a rise-time sign and a fall-time signal therefrom; and means for receiving the rise-time signal and the fall-time signal and generating a period-normalized fractional phase signal therefrom.

19. The digital fractional phase detector according to claim 18 further comprising means for combining the period-normalized fractional phase signal with an accumulated frequency control word fractional phase signal to generate a fractional phase compensated signal therefrom.

20. A digital fractional phase detector comprising:

first means for receiving a first clock signal, wherein the first receiving means comprises a plurality of delay elements selected from the group consisting of inverters, a tapped delay line, and buffers;

second means for receiving a second clock signal, wherein the second receiving means comprises a plurality of latch/registers and coupled to said first means for storing a delayed replica of said first clock signal;

a digital edge detecting means responsive to said first and second means for generating a rise-time signal associated with a positive transition of the first clock and further for generating a fall-time signal associated with a negative transition of the first clock; and means for receiving an accumulated frequency control word fractional phase signal and said rise-time and fall-time signals to generate a fractional phase compensated signal therefrom.

21. The digital fractional phase detector according to claim 20 wherein the first clock signal is associated with a digitally-controlled voltage controlled oscillator (dVCO).

22. The digital fractional phase detector according to claim 21 wherein the second clock is associated with a frequency reference oscillator.

23. A digital fractional phase detector comprising:

a plurality of delay elements connected in tandem, wherein each delay element has an input and an output, and further wherein the first delay element input is a VCO clock input;

a plurality of latch/registers, wherein each latch/register has a first input connected to an output of a different delay element, and further wherein each latch/register has a second input configured to receive a common frequency reference clock signal, and further wherein each latch/register has an output;

a digital edge detector having a plurality of inputs, wherein each edge detector input is connected to a different latch/register output, and further having a pair of outputs;

a normalizer element having a pair of inputs connected to the pair of edge detector outputs, and further having an output; and a combinatorial element having an input connected to the output of the normalizer element and further having an output.

24. The digital fractional phase detector according to claim 23 wherein the plurality of delay elements are selected from the group consisting of inverters, a tapped delay line, and buffers.

25. The digital fractional phase detector according to claim 24 wherein the digital fractional phase detector is configured to increase overall resolution of an integer phase-locked loop (PLL) such that a quantization error c of the integer PLL is corrected.

26. A digital factional phase detector comprising:

means for receiving a digitally-controlled voltage controlled oscillator (dVCO) clock signal;

means for receiving a frequency reference clock signal and storing a snapshot of a delayed replica of said dVCO clock signal data in response to significant edge transitions associated with the frequency reference clock signal;

means for retrieving the delayed replica of said dVCO clock signal data in response to the frequency reference clock signal and generating a fit time-to-digital signal and a second time-to-digital signal therefrom; and means for receiving the first time-to-digital signal and the second time-to-digital signal and generating period-normalized factional phase signal therefrom.

27. The digital fractional phase detector according to, claim 26 further comprising means for receiving the first time-to-digital signal and the second time-to-digital signal and generating a period-normalized fractional phase signal therefrom.

28. The digital fractional phase detector according to claim 27 further comprising means for combining the period-normalized fractional phase signal with an accumulated frequency control word fractional phase signal to generate a fractional phase compensated signal therefrom.

29. The digital fractional phase detector according to claim 28 wherein the digital fractional phase detector is configured to increase overall resolution of an integer phase-locked loop (PLL) such that a quantization error $\epsilon$ of the integer PLL is corrected.

* * * * *